United States Patent
Cha et al.

(10) Patent No.: US 11,008,652 B2
(45) Date of Patent: May 18, 2021

(54) SWIRLED FLOW CHEMICAL VAPOR DEPOSITION

(71) Applicants: Rolls-Royce Corporation, Indianapolis, IN (US); Rolls-Royce High Temperature Composites, Inc., Cypress, CA (US)

(72) Inventors: Chong M. Cha, Carmel, IN (US); David Liliedahl, Fishers, IN (US); Richard W. Kidd, Rancho Palos Verdes, CA (US); Ross Galligher, Costa Mesa, CA (US); Nicholas Doan, Fountain Valley, CA (US)

(73) Assignees: Rolls-Royce Corporation, Indianapolis, IN (US); Rolls-Royce High Temperature Composites, Inc., Cypress (CA)

( * ) Notice: Subject to any disclaimer, the term of this patent is extended or adjusted under 35 U.S.C. 154(b) by 185 days.

(21) Appl. No.: 16/268,761

(22) Filed: Feb. 6, 2019

(65) Prior Publication Data
US 2019/0169740 A1    Jun. 6, 2019

Related U.S. Application Data

(62) Division of application No. 15/677,378, filed on Aug. 15, 2017, now Pat. No. 10,227,696.
(Continued)

(51) Int. Cl.
*C23C 16/04* (2006.01)
*C23C 16/24* (2006.01)
(Continued)

(52) U.S. Cl.
CPC ............ *C23C 16/045* (2013.01); *C23C 16/24* (2013.01); *C23C 16/4412* (2013.01);
(Continued)

(58) Field of Classification Search
CPC .................................................. C23C 16/045
See application file for complete search history.

(56) References Cited

U.S. PATENT DOCUMENTS

| 4,580,524 A | 4/1986 | Lackey, Jr. et al. |
| 4,945,856 A | 8/1990 | Stewart |

(Continued)

FOREIGN PATENT DOCUMENTS

| CN | 102212800 A | 10/2011 | |
| CN | 105189932 | * 12/2015 | ............. C04B 41/87 |

(Continued)

OTHER PUBLICATIONS

Communication under Rule 71(3) EPC from counterpart EP Application No. 17184505.0 dated Jan. 7, 2020, 38 pgs.
(Continued)

*Primary Examiner* — Keath T Chen
(74) *Attorney, Agent, or Firm* — Shumaker & Sieffert, P.A.

(57) ABSTRACT

A system may include a reactor vessel comprising an outer wall, a heat source thermally coupled to the reactor vessel, at least one reactor inlet in the outer wall, and at least one reactor outlet. The reactor vessel may be configured to house a porous preform in a radially central core region. The at least one reactor inlet may be configured to introduce a precursor gas to the reactor vessel to produce swirling flow of the precursor gas around the radially central core region of the reactor vessel. The at least one reactor outlet may be configured to remove exhaust gas from the reactor vessel and assist in maintaining a dynamic pressure of the reactor vessel greater than a pressure in the porous preform.

14 Claims, 4 Drawing Sheets

Related U.S. Application Data

(60) Provisional application No. 62/381,349, filed on Aug. 30, 2016.

(51) Int. Cl.
  *C23C 16/455* (2006.01)
  *C23C 16/458* (2006.01)
  *F01D 5/28* (2006.01)
  *C23C 16/44* (2006.01)
  *C23C 16/46* (2006.01)
  *C23C 16/52* (2006.01)

(52) U.S. Cl.
  CPC ...... *C23C 16/4584* (2013.01); *C23C 16/4588* (2013.01); *C23C 16/45502* (2013.01); *C23C 16/45563* (2013.01); *C23C 16/46* (2013.01); *C23C 16/52* (2013.01); *F01D 5/288* (2013.01); *F05D 2230/90* (2013.01); *F05D 2300/6033* (2013.01); *Y02T 50/60* (2013.01)

(56) References Cited

U.S. PATENT DOCUMENTS

| | | | | |
|---|---|---|---|---|
| 5,229,081 | A | * | 7/1993 | Suda ............... C23C 16/455 118/620 |
| 5,788,728 | A | * | 8/1998 | Solis ............... B01D 45/12 55/422 |
| 6,329,718 | B1 | | 12/2001 | Van Ngo et al. |
| 6,428,847 | B1 | * | 8/2002 | Grant ............... C23C 16/455 118/715 |
| 6,744,023 | B2 | | 6/2004 | Garn et al. |
| 7,223,465 | B2 | | 5/2007 | Subramanian et al. |
| 9,376,749 | B2 | | 6/2016 | Hegermann et al. |
| 2001/0035124 | A1 | | 11/2001 | Okayama et al. |
| 2002/0108741 | A1 | * | 8/2002 | Jonnalagadda ....... F28D 7/1646 165/159 |
| 2007/0062455 | A1 | | 3/2007 | Saxler |
| 2007/0202253 | A1 | | 8/2007 | Ong |
| 2008/0124462 | A1 | | 5/2008 | Waghray et al. |
| 2009/0325340 | A1 | | 12/2009 | Aslami |
| 2010/0156005 | A1 | * | 6/2010 | Chang ............... C04B 35/571 264/406 |
| 2011/0033631 | A1 | * | 2/2011 | Malshe ............... C23C 24/00 427/459 |
| 2011/0171399 | A1 | | 7/2011 | Brun |
| 2012/0288615 | A1 | | 11/2012 | Jung |
| 2012/0291696 | A1 | | 11/2012 | Clarke |
| 2014/0154417 | A1 | * | 6/2014 | Choi ............... C30B 25/005 427/255.28 |
| 2014/0204259 | A1 | | 7/2014 | Mitsui et al. |
| 2015/0041454 | A1 | * | 2/2015 | Foret ............... H05H 1/40 219/601 |
| 2015/0218693 | A1 | * | 8/2015 | Bertrand ............... C23C 16/46 118/718 |

FOREIGN PATENT DOCUMENTS

| | | |
|---|---|---|
| DE | 102012100176 A1 | 7/2013 |
| EP | 0410442 A1 | 1/1991 |
| WO | 0233143 A1 | 4/2002 |

OTHER PUBLICATIONS

Besmann et al., "Overview of Chemical Vapor Infiltration", ORNL report Conf-930961-2, 1993, 20 pgs. Applicant points out, in accordance with MPEP 609.04(a), that the year of publication, 1993, is sufficiently earlier than the effective U.S. filing date, 2017, so that the particular month of publication is not in issue.

Besmann et al., "Vapor-phase fabrication and properties of continuous-filament ceramic composites", Sep. 1991, 1 pg., Abstract only provided.

Extended Search Report from counterpart European Application No. 17184505.0, dated Jan. 4, 2018, 9 pp.

Liao M.H. et al., "The novel chamber hardware design to improve the thin film deposition quality in both 12" (300 mm) and 18" (450 mm) wafers with the development of 3D full chamber modeling and experimental visual technique". AIP Advances 3, 072117 (2013), pp. 1-8.

Barbosa, Divani C., et al., "Numerical Simulation of HFCVD Process Used for Diamond Growth". Brazilian Journal of Physics, vol. 36, No. 2A, Jun. 2006, pp. 313-316.

Gadgil, "Optimization of a stagnation point flow reactor design for metalorganic chemical vapor deposition by flow visualization". Journal of Crystal Growth, vol. 134, Issue 3-4, Dec. 1993, pp. 302-312.

Response to communication under Rule 70a(1) EPC from European counterpart application 17184505.0 dated Mar. 12, 2018, filed Jun. 25, 2018 (63 pgs.).

Prosecution History from U.S. Appl. No. 15/677,378, dated Apr. 9, 2018 through Nov. 1, 2018, 35 pp.

* cited by examiner

SWIRLED FLOW CHEMICAL VAPOR DEPOSITION

RELATED APPLICATIONS

This application is a divisional of U.S. application Ser. No. 15/677,378, filed Aug. 15, 2017, which claims the benefit of U.S. Provisional Application No. 62/381,349 filed Aug. 30, 2016, both of which are incorporated herein by reference in their entirety.

TECHNICAL FIELD

The disclosure relates to chemical vapor deposition and apparatuses for performing chemical vapor deposition.

BACKGROUND

Chemical vapor infiltration (CVI), a form of chemical vapor deposition, may be used to deposit ceramic matrix materials for ceramic matrix composites (CMCs). CMCs include ceramic fibers embedded in a ceramic matrix. CMCs may have excellent mechanical, physical, and chemical properties such as high fracture toughness, thermal shock resistance, and elongation resistance. CMCs may be used for a variety of applications such as gas turbine engines, brake discs, and the like.

An example CMC is silicon carbide-fiber reinforced silicon carbide (SiC/SiC) composite.

SUMMARY

In some examples, the disclosure describes a method that may include heating, using a heat source, a reactor vessel including a substrate in a radially central core region of the reactor vessel. The method may also include introducing, using at least one reactor inlet in an outer wall of the reactor vessel, a precursor gas to the reactor vessel. The at least one reactor inlet may be configured to produce swirling flow of the precursor gas around the radially central core region of the reactor vessel. The method may also include removing, using at least one reactor outlet, an exhaust gas from the reactor vessel.

In other examples, the disclosure describes a system that may include a reactor vessel comprising an outer wall, a heat source thermally coupled to the reactor vessel, at least one reactor inlet in the outer wall, and at least one reactor outlet. The reactor vessel may be configured to house a substrate in a radially central core region. The at least one reactor inlet may be configured to introduce a precursor gas to the reactor vessel to produce swirling flow of the precursor gas around the radially central core region of the reactor vessel. The at least one reactor outlet may be configured to remove exhaust gas from the reactor vessel.

In other examples, the disclosure describes a controller that may be configured to control a heat source to heat a reactor vessel including a substrate in a radially central core region of the reactor vessel. The controller also may be configured to control at least one reactor inlet in an outer wall of the reactor vessel to introduce a precursor gas to the reactor vessel. The at least one reactor inlet may be configured to produce swirling flow of the precursor gas around the radially central core region of the reactor vessel. The controller may also be configured to control at least one reactor outlet to remove exhaust gas from the reactor vessel.

The details of one or more examples are set forth in the accompanying drawings and the description below. Other features, objects, and advantages of the disclosure will be apparent from the description and drawings, and from the claims.

DETAILED DESCRIPTION

Figure 1:
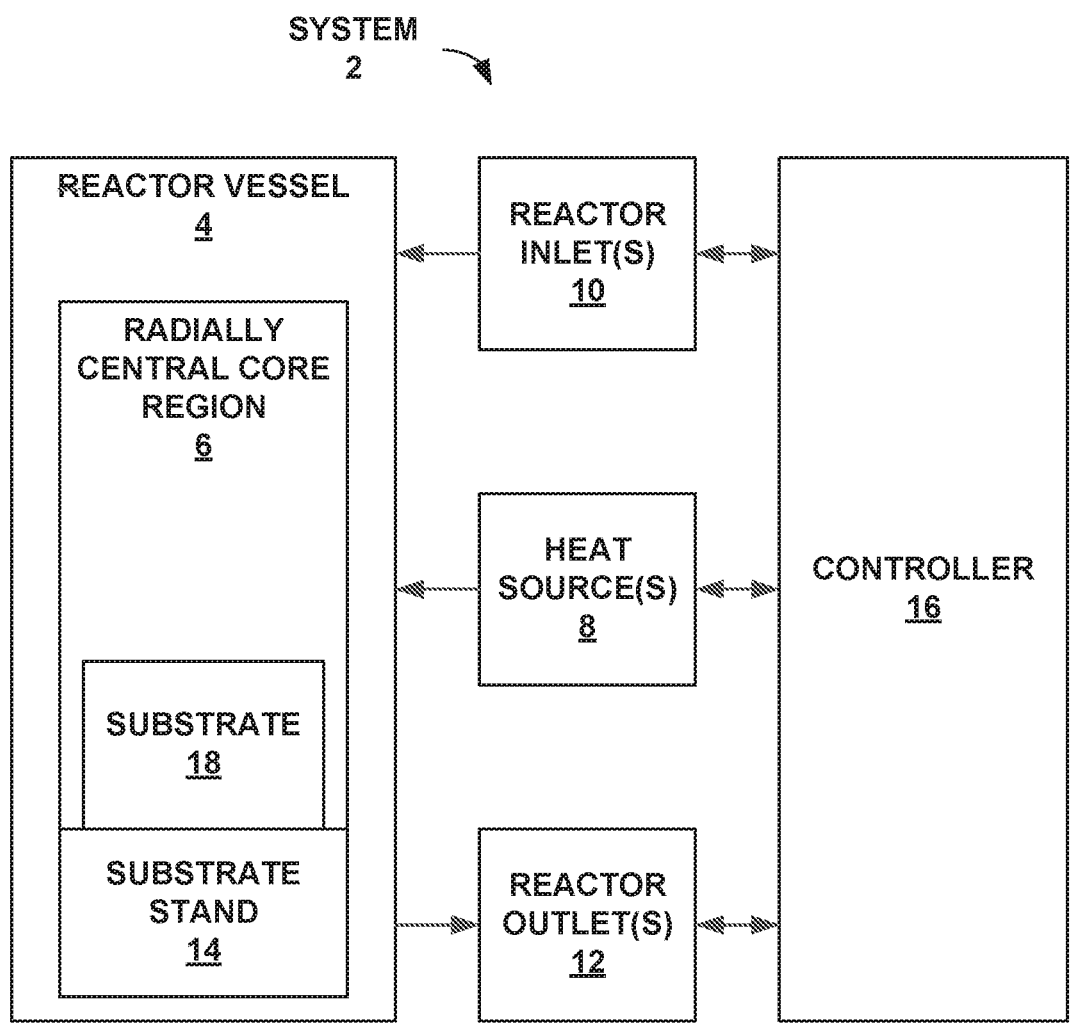
FIG. 1 is a conceptual and schematic block diagram illustrating an example system for manufacturing a composite using chemical vapor infiltration or deposition.

The disclosure describes systems and techniques for manufacturing articles, such as ceramic matrix composites (CMCs) and coated substrates, using chemical vapor infiltration (CVI) or chemical vapor deposition (CVD). In some examples, a CVI/CVD reactor vessel may include an outer wall and at least one reactor inlet in the outer wall. The at least one reactor inlet may be configured to introduce a precursor gas to the reactor vessel to produce swirling flow of the precursor gas around a radially central core region of the reactor vessel. A swirling flow may refer to a flow of precursor gas that includes a circumferentially directed velocity component.

Articles, such as CMCs and substrates with coatings, may be manufactured by fabricating a substrate and depositing matrix or coating material in or on the substrate. To manufacture a CMC, the substrate may be a porous preform that forms reinforcement within the CMC, and CVI may be used to deposit a matrix material in the porous substrate on reinforcement. In some examples, CVI may be used to infiltrate a porous preform with precursor gas, from which a matrix material deposits in the porous preform to form a matrix surrounding the reinforcing materials of the porous preform. In some examples, CVD may be used to contact a non-porous preform with precursor gas, from which the coating material deposits onto the non-porous preform to form a coating on the non-porous preform.

In some examples, CMCs may be manufactured by fabricating a porous preform that includes ceramic fibers or ceramic fiber precursors, infiltrating the porous preform with matrix material to form an infiltrated preform, and finishing the infiltrated preform with any further treatments, such as heat treatments, coatings, or the like, to form the final CMC. CVI may be used to infiltrate the porous preform with precursor gas, from which the ceramic matrix material deposits in the porous preform to form the ceramic matrix surrounding the ceramic fibers or ceramic precursor fibers of the porous preform. CVI uses high temperature gases to infiltrate the porous preform and deposit the matrix material onto the ceramic fibers. Deposition of the precursor gas onto the ceramic fibers may be controlled by factors such as temperature of precursor gas, concentration of precursor gas, temperature of the porous preform, temperature gradient within the porous preform, flow rate of the precursor gas, residence time of precursor gas with the chemical vapor infiltration reactor, and the like.

A system for manufacturing an article may include a reactor vessel, a heat source, at least one reactor inlet, and at least one reactor outlet. The reactor vessel may include an outer wall and a radially central core region. The reactor vessel may house a substrate in the radially central core region. The heat source may be thermally coupled to the reactor vessel. The at least one reactor inlet may be in the outer wall, and may be configured to introduce a precursor gas to the reactor vessel to produce swirling flow of the precursor gas around the radially central core region of the reactor vessel. The at least one reactor outlet may remove exhaust gas from the reactor vessel.

In some examples, the swirling flow of the precursor gas around the radially central core region may allow for greater control of temperature conditions at the substrate. In some implementations, the swirling flow of the precursor gas may increase temperature uniformity of the precursor gas within the reactor vessel. For example, a swirling flow may increase the residence time and mixing of precursor gas, which may cause a more uniform precursor gas temperature and, correspondingly, a more uniform precursor deposition rate and distribution in or on the substrate. In some examples, the swirling flow of the precursor gas may be used to create two dimensional thermal gradients across the substrate (e.g., within a porous preform). For example, in a thermal gradient CVI process, in which a thermal gradient exists within the porous preform, swirling or spiraling flow may contact multiple sides of the porous preform and allow for the creation of both axial and radial thermal gradients.

In some examples, the reactor vessel also may include a substrate stand that may be selectively rotated. In combination with the swirling flow of the precursor gas, a rotating substrate stand may allow for greater control of precursor flux into or onto the substrate compared to a CVI/CVD reactor in which precursor gases flow linearly through the reactor vessel. For example, in a diffusive CVI process, the rotating substrate stand may rotate at a rate so the circumference of a porous preform is moving approximately the same rate as the precursor gases are swirling. This reduces relative rotational (circumferentially directed) motion between the porous preform and the precursor gases, and results in diffusion of the precursor gases being favored over convection. As another example, the rotating preform may rotate more slowly, not rotate at all, or rotate in the opposite direction as the swirl direction of the precursor gases, which may result in a relative rotational (circumferentially directed) velocity between the circumference of a porous preform and the precursor gases. This may favor convection over diffusion and result in a forced flow CVI process, which may provide increased uniformity of precursor gas concentration within the porous preform.

In some examples, the swirling flow of the precursor gas may allow for faster or more uniform heating or cooling of the reactor vessel or substrate, as heat transfer may be improved across a volume of the reactor vessel. In some examples, the substrate may be rotated during heating or cooling to more quickly or more uniformly heat or cool the substrate.

In some examples, articles produced using the systems and techniques of this disclosure may be produced faster with greater matrix or coating material uniformity (e.g., fewer voids in the matrix or compositional differences within the matrix) and less wasted precursor gas. Articles formed using the techniques described herein may include coated substrates and composites, such as ceramic matrix composites. Example ceramic matrix composites may include carbon(C)/C composites, C/silicon carbide (SiC) composites, SiC/SiC composites, SiC/Si—SiC composites, alumina($Al_2O_3$)/$Al_2O_3$ composites, and the like, wherein the reinforcement material is listed first and the matrix material listed second. These ceramic matrix composites may be used for a variety of applications including, but not limited to, gas turbine engine components for aerospace propulsion, maritime propulsion, and power generation.

FIG. 1 is a conceptual and schematic block diagram illustrating an example system 2 for manufacturing articles using CVI/CVD. System 2 includes reactor vessel 4, heat source 8, reactor inlet(s) 10, and reactor outlet(s) 12. In some examples, as shown in FIG. 1, system 2 may optionally include rotating substrate stand 14, controller 16, or both.

System 2 includes reactor vessel 4. Reactor vessel 4 may be configured to house substrate 18 in a radially central core region 6 and facilitate chemical vapor infiltration or deposition of precursor gas into or onto substrate 18 to form a composite. Reactor vessel 4 may be configured to handle a variety of CVI and CVD processes including isothermal CVI, diffusive flow CVI, thermal gradient CVI, forced flow CVI, pulsed flow CVI, atmospheric pressure CVD, low pressure CVD, ultra-high vacuum CVD, and the like. In some examples, reactor vessel 4 may include temperature sensing and control equipment, pressure sensing and control equipment, flow sensing and control equipment, and the like, such as heaters, coolers, temperature gauges, pressure gauges, flow meters, purge valves, and outlet valves.

Reactor vessel 4 may include an outer wall. The outer wall of reactor vessel 4 may be the structural portion of reactor vessel 4 that extends axially and circumferentially bounds an enclosed volume in which the CVI/CVD technique occurs. In some examples, reactor vessel 4 includes multiple walls or structures that define the reactor vessel 4. As used herein, an outer wall of reactor vessel 4 is a wall that bounds at least one side of the internal volume of reactor vessel 4 in which substrate 18 is housed and into which the precursor gas is introduced. For example, if reactor vessel 4 is cylindrical, the outer wall may be the curved axially extending side of reactor vessel 4 that bounds the circumference of the cylinder. In some examples, the outer wall may include a conductive heating element, such as a graphite susceptor. Additionally, in some examples, the material from which an interior surface of the outer wall is formed may be substantially inert to the precursor gases used in the CVI/CVD technique.

Reactor vessel 4 may include radially central core region 6 within the enclosed volume of reactor vessel 4. Radially central core region 6 is a conceptual region within reactor vessel 4 and may be the functional volume of reactor vessel 4 around which precursor gas circumferentially flows as a bulk fluid. In some examples, radially central core region 6 may be the volume substantially occupied by substrate 18. For example, if substrate 18 is a cylindrical pipe positioned on its flat base in the center of reactor vessel 4, radially central core region 6 may be the cylindrical volume around which the precursor gas flows; in this example, the cylindrical volume may be defined by the dimensions of the pipe. In other examples, radially central core region 6 may not be defined by the shape and size of substrate 18, but may be a volume in the center portion of the volume enclosed by reactor vessel 4 adjacent to substrate stand 14. In some examples, radially central core region 6 may extend from a top of reactor vessel 4 (or near a top of reactor vessel 4) to substrate stand 14.

Reactor vessel 4 may be configured to enclose substrate 18. Substrate 18 may be a porous preform or non-porous preform. In some examples in which substrate 18 includes a porous preform, substrate 18 may include a reinforcing material, such as a ceramic fiber or ceramic fiber precursor reinforcement structure. Substrate 18 may include any one of a variety of shapes and porosities, depending on the final use of the article formed from substrate 18. For example, substrate 18 may include a porous or non-porous preform having a relatively complex geometry, such as a gas turbine engine airfoil, or a relatively simple geometry, such as a brake disc.

In examples in which substrate 18 is a porous preform, substrate 18 may include reinforcement material in one or more of a variety of different configurations, including, but not limited to: chopped fibers or tows, nonwoven fibers or tows, woven fibers or tows, braided fibers or tows, bundled fibers or tows, fabrics, three-dimensional weaves of fibers or tows, or the like. The reinforcing materials of substrate 18 may be selected for a variety of properties including, but not limited to, modulus of elasticity, tensile strength, thermal stability, density, and filament diameter. A wide variety of reinforcing materials may be used including, but not limited to: ceramic fiber and ceramic fiber precursor materials such as silicon carbide (SiC), carbon (C), alumina ($Al_2O_3$), mullite ($3Al_2O_3 2SiO_2$ or $2Al_2O_3 SiO_2$), precursors of these ceramics, or the like; metals, and polymers. In some examples in which substrate 18 includes a porous preform, substrate 18 may be supported during CVI/CVD, such as by a wire support cage or stand or a graphite holder.

System 2 includes at least one reactor inlet(s) 10 in the outer wall of reactor vessel 4. Reactor inlet(s) 10 may be configured to introduce a precursor gas to reactor vessel 4 to produce swirling flow of the precursor gas around radially central core region 6. As described above, as used herein, a swirling flow means that the bulk flow profile of the precursor gas within reactor vessel 4 includes a circumferential component. In some examples, reactor inlet(s) 10 may be angled to produce swirling flow around radially central core region 6. In some examples, reactor inlet(s) 10 may be positioned near the top of reactor vessel 4. In some examples, reactor inlet(s) 10 may be positioned in the outer wall of reactor vessel 4 at multiple circumferential locations, e.g., spaced apart by a similar arc length. This may facilitate establishment of a swirling flow of the precursor gas within reactor vessel 4.

In some examples, in addition to or instead of multiple reactor inlet(s) 10 being positioned at circumferentially spaced locations of the outer wall, two or more reactor inlets 10 may be distributed axially along the outer wall reactor vessel 4. For example, one reactor inlet 10 may be positioned at the top of reactor vessel 4 and one reactor inlet 10 may be positioned in the middle of the outer wall of reactor vessel 4 to sustain swirling flow through reactor vessel 4. Thus, multiple reactor inlet(s) 10 may be positioned in the outer wall of reactor vessel 4 at different circumferential locations, different axial locations, or both, to facilitate establishment of swirling flow of the precursor gas within reactor vessel 4.

Reactor inlet(s) 10 may include directional or distributive flow devices such as jet injectors. In some examples, reactor inlet(s) 10 may be configured to introduce the precursor gas at an angle relative to the outer wall of reactor vessel 4 to produce a particular swirling flow profile. The angle may be between 0 degrees and 90 degrees from a surface that is tangential to the outer wall of reactor vessel 4 at the location of the respective reactor inlet 10. In some examples, in addition to being angled relative to the outer wall to produce swirling flow, reactor inlet(s) 10 may be oriented at an axial angle from a tangential surface of the outer wall to produce an axial flow component to the swirled flow. For example, the precursor gas may be introduced at an axial angle between 0 and 10 degrees from a normal surface of the outer wall.

The gas precursor may be selected according to the precursor matrix or coating of the article. The gas precursor may be selected for a variety of properties including, but not limited to, tensile strength, thermal stability, crack resistance, fracture toughness, and corrosion resistance. A variety of gas precursors may be used including, but not limited to: hydrocarbon gas, such as methane and propane, for a carbon matrix or coating; carbosilanes, such as methyltrichlorosilane ($CH_3SiCl_3$), for a silicon carbide matrix or coating; silanes, such as dichlorosilane and tetraethylorthosilicate, for a silicon matrix or coating; aluminum halides, such as aluminum chloride ($AlCl_3$), for an alumina ($Al_2O_3$) matrix or coating; metal halides, such as tungsten hexafluoride and titanium pentachloride; metal carbonyls, such as nickel carbonyl; any other precursor suitable for forming a selected coating; or the like.

In some examples, reactor inlet(s) 10 may be configured to introduce other gases, such as inert gases, to reactor vessel 4. Other gases may be introduced to dilute precursor gas, heat reactor vessel 4 or substrate 18, cool reactor vessel 4 or substrate 18, purge reactor vessel 4, or the like. Thus, the gas(es) introduced through reactor inlet(s) 10 may be different at different steps of the CVI/CVD technique. For example, reactor inlet(s) 10 may introduce a heated inert gas into reactor vessel 4 to heat reactor vessel 4 and, if present, substrate 18 prior to introducing the precursor gas. As another example, reactor inlet(s) 10 may introduce a relatively cool inert gas into reactor vessel 4 to cool reactor vessel 4 and substrate 18 after completing deposition of the matrix material in or coating material on substrate 18. In some examples, reactor inlet(s) 10 may be further configured to introduce a carrier gas with the precursor gas. Carrier gases may include, but are not limited to, hydrogen gas, argon gas, helium gas, and the like.

System 2 also includes at least one reactor outlet(s) 12 in the outer wall of reactor vessel 4. Reactor outlet(s) 12 may be configured to remove exhaust gas from reactor vessel 4. Exhaust gas may include unreacted precursor gas, inert gas, reaction byproduct gas, or the like. In some examples, reactor outlet(s) 12 may be positioned to assist in creation of swirling flow of the precursor gases. For example, reactor outlet(s) may be positioned at a radial angle from a normal surface of the outer wall to draw flow of precursor gas in a direction that may encourage swirling flow. In some examples, reactor outlet(s) 12 may be located at the bottom of reactor vessel 4. In this way, outlet(s) 12 may assist in producing an axial flow component of the precursor gases within reactor vessel 4.

System 2 also includes heat source 8. Heat source 8 may be thermally coupled to reactor vessel 4 and configured to heat reactor vessel 4. In some examples, heat source 8 may be a heater that heats reactor vessel 4. In some examples, reactor vessel 4 may be a hot wall reactor vessel and heat source 8 may be a heater within the reactor vessel wall(s). Heat source 8 may include induction heaters, convection heaters, furnace heaters, plasma sources, and the like.

System 2 may also include substrate stand 14. Substrate stand 14 may be configured to seat substrate 18 within reactor vessel 4. In some examples, substrate stand 14 may include perforations to allow for flow of gas through substrate stand 14. For example, if substrate 18 positioned on substrate stand 14 includes a cavity or pores, the perforations in substrate stand 14 may allow gas to pass through substrate stand 14 into the cavity or pores of substrate 18 or from the cavity or pores of substrate 18 through substrate stand 14. In some examples, system 2 may include multiple substrate stands 14 to allow CVI/CVD to be performed on multiple substrates within reactor vessel 4 in parallel. In some examples, substrate stand 14 may include heating components configured to heat substrate 18, such as for thermal gradient CVI or CVD.

In some examples, substrate stand 14 may be configured to rotate, e.g., about an axis extending substantially parallel to the axial direction of reactor vessel 4. For example, substrate stand 14 may be coupled to a shaft and motor. In some examples, the motor and shaft may be configured to selectively rotate in one of two opposite rotational directions, to selectively rotate substrate 18 in opposite rotational directions. Further, the motor and shaft may be configured to rotate at different rotational velocities. In this way, a substrate stand 14 that is configured to rotate may be used to rotate substrate 18 at a controlled rotational velocity relative to the outer wall of reactor vessel 4 and, optionally, relative to the rotational (or swirling) flow velocity of the precursor gas within reactor vessel 4.

System 2 may also include controller 16, which is communicatively coupled to at least heat source 8, reactor inlet(s) 10, and reactor outlet(s) 12. Controller 16 may include any of a wide range of devices, including processors (e.g., one or more microprocessors, one or more application specific integrated circuits (ASICs), one or more field programmable gate arrays (FPGAs), or the like), one or more servers, one or more desktop computers, one or more notebook (i.e., laptop) computers, one or more cloud computing clusters, or the like.

Controller 16 may be communicatively coupled to heat source 8. In some examples, controller 16 may control heat source 8 to heat reactor vessel 4, including substrate 18 in radially central core region 6. For example, controller 16 may control a heater to directly provide heat to the outer wall of reactor vessel 4. In another example, controller 16 may control a preheater to heat an inert gas that, for example, controller 16 controls reactor inlet(s) 10 and an inert gas source to introduce to reactor vessel 4 through reactor inlet(s) 10. In some examples, controller 16 may receive temperature information from reactor vessel 4.

Controller 16 may also be communicatively coupled to reactor inlet(s) 10. In some examples, controller 16 may control at least one reactor inlet 10 in the outer wall of reactor vessel 4 and, optionally, a precursor gas source, a control valve, jet ejector, pump, or the like, to introduce precursor gas to reactor vessel 4 at a particular flow rate or to achieve a particular precursor gas concentration in reactor vessel 4. In other examples, controller 16 may control reactor inlet(s) 10 and, optionally, the control valve, jet ejector, pump, a carrier gas supply, or the like, to introduce carrier gas to reactor vessel 4 to heat reactor vessel 4 to a particular temperature or to achieve a particular precursor gas concentration in reactor vessel 4.

Controller 16 additionally may be communicatively coupled to reactor outlet(s) 12. In some examples, controller 16 may control at least one of reactor outlet(s) 12 to remove exhaust gas from reactor vessel 4. For example, controller 16 may control reactor outlet(s) 12 and, optionally, a control valve, vacuum pump, or the like, to remove exhaust gas from reactor vessel 4 at a particular flow rate or to maintain a particular pressure or precursor gas residence time in reactor vessel 4. For example, in a low pressure CVD process, controller 16 may control a vacuum pump to create low pressure in reactor vessel 4.

Operation of controller 16 in system 2 will be described with reference to FIG. 2.

Figure 2:
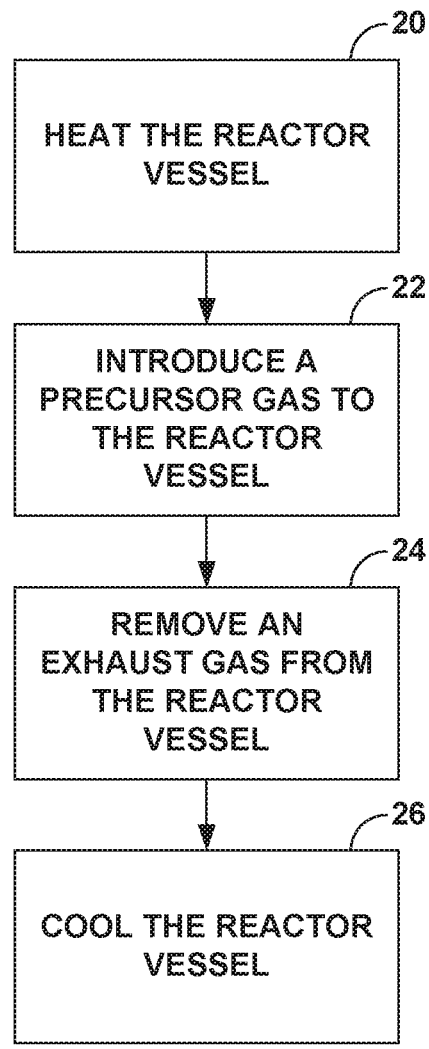
FIG. 2 is a flow diagram illustrating an example technique for manufacturing a composite using swirled flow chemical vapor infiltration or deposition.

FIG. 2 is a flow diagram illustrating an example technique for manufacturing articles using swirled flow CVI/CVD. The technique of FIG. 2 will be described with concurrent reference to system 2 of FIG. 1, although one of ordinary skill will understand that the technique of FIG. 2 may be performed by other systems that include more or fewer components, and that system 2 may perform other techniques. The technique of FIG. 2 may achieve one or more of a variety of CVI conditions, including isothermal, non-isothermal, diffusive flow, and forced flow, and one or more of a variety of CVD conditions, including atmospheric pressure, low pressure, and ultra-high vacuum.

In isothermal CVI conditions, substrate 18 may be porous and have a substantially uniform temperature throughout substrate 18. The rate of precursor gas decomposition and precursor deposition on and in substrate 18 may be sensitive to temperature changes. By reducing temperature gradients throughout substrate 18, matrix material may deposit from the precursor gas more uniformly throughout substrate 18. Temperature gradients may be reduced by maintaining an average precursor temperature of the precursor gas and a reactor vessel temperature of reactor vessel 4 substantially similar to an average substrate temperature of substrate 18. A swirled flow of precursor gas may, for example, create a more uniform temperature of precursor gas in reactor vessel 4 and at one or more surfaces of substrate 18 compared to conditions that do not include swirl flow of precursor gases within reactor vessel 4.

In non-isothermal CVI conditions, substrate 18 may be porous and have a thermal gradient throughout substrate 18. For example, gases in reactor vessel 4 may be cooler than substrate 18, leading to relatively cooler surface temperatures and relatively hotter interior temperatures of substrate 18. Precursor gas may decompose at a higher rate at the hotter portions of substrate 18 than the cooler portions, leading to a higher rate of precursor deposition at the hotter portions than the cooler portions. This thermal gradient may lead to greater gas diffusivity and faster matrix material deposition within the interior of substrate 18. In some examples, the thermal gradient may be axial, while in other examples, the thermal gradient may be radial. Temperature gradients may be created by maintaining an average precursor temperature of the precursor gas and the reactor vessel temperature of reactor vessel 4 less than an average substrate temperature of substrate 18, by heating substrate 18, e.g., using substrate stand 14, or both. A swirled flow of precursor gas may, for example, create a more uniform temperature of precursor gas in reactor vessel 4 and, thus, a more uniform temperature at a surface of substrate 18.

In diffusive CVI conditions of the technique of FIG. 2, substrate 18 may be porous and have a substantially uniform pressure throughout substrate 18, which may be substantially equal to a pressure of the precursor gas outside radially central core region 6 of reactor vessel 4. Substrate 18 includes pores that limit the rate of diffusion of precursor gas into substrate 18. Because of this, a concentration of precursor gas at the surface of substrate 18 may be greater than the concentration of precursor gas in substrate 18. Precursor gas may diffuse through the pores into substrate 18 due to the concentration difference inside and outside substrate 18. By controlling flow conditions and pressure conditions for diffusive flow of precursor gas into substrate 18, the infiltration of precursor gas into substrate 18 may be improved. Pressure gradients across substrate 18 may be reduced by maintaining a pressure in pores of substrate 18 substantially similar to a pressure in reactor vessel 4, rotating substrate stand 14 and substrate 18 at a rate substantially similar to the swirling flow rate of precursor gases adjacent to the outer surface of substrate 18, or both. A swirled flow of precursor gas may, for example, create a more uniform concentration of precursor gas in reactor vessel 4 and at a surface of substrate 18. Rotating substrate 18 on substrate stand 14 may, for example, reduce relative velocity between substrate 18 and precursor gas to reduce convective flow of the precursor gas relative to substrate 18 and increase the relative magnitude of radial diffusion of precursor gas into pores of substrate 18 compared to convective flow of precursor gas into pores of substrate 18.

In forced flow CVI conditions of the technique of FIG. 2, substrate 18 may be porous and have a precursor gas flow into substrate 18 at a rate that is greater than the rate of diffusion of precursor gas into substrate 18. Precursor gas may be forced into substrate 18 through flow conditions that create a finite pressure gradient across substrate 18. By increasing the flow of precursor gas into substrate 18, the rate of precursor deposition in substrate 18 may be increased. Pressure gradients across substrate 18 may be created by maintaining a dynamic pressure in reactor vessel 4 substantially greater than a pressure in substrate 18, by creating a difference in rotational rate between substrate 18 and the swirling flow rate of precursor gases adjacent to the outer surface of substrate 18, or both. A swirled flow of precursor gas may, for example, create a more uniform concentration of precursor gas in reactor vessel 4 and increase convection at or near substrate 18 when substrate 18 is not rotated or rotated at a different rotational rate and/or direction than the direction of swirled flow of precursor gas.

In low pressure or ultra-high vacuum CVD conditions of the technique of FIG. 2, substrate 18 may be non-porous and reactor vessel 4 may enclose a pressure that is less than atmospheric pressure. By decreasing the pressure in reactor vessel 4, the mass transport velocity of the precursor gas may decrease, so that the precursor gas may deposit more evenly on a surface of substrate 18. A swirled flow of precursor gas may, for example, create a more uniform concentration of precursor gas in reactor vessel 4 and at a surface of substrate 18, create a more uniform temperature within reactor vessel 4 and at a surface of substrate 18, or the like. Rotating substrate 18 on substrate stand 14 may, for example, reduce relative velocity between substrate 18 and precursor gas to reduce convective flow of the precursor gas relative to substrate 18.

In some examples, although not shown in FIG. 2, substrate 18 may be heated to a substrate temperature. In some examples, heat source 8 may heat substrate 18. For example, heat source 8 may be a heater, and controller 16 may control heat source 8 to heat substrate 18 to the substrate temperature. In another example, controller 16 may control a heater to heat an inert gas to a temperature equal to or greater than the substrate temperature and control one or more reactor inlet(s) 10 to introduce the heated inert gas to reactor vessel 4 to heat substrate 18 to the substrate temperature. In some examples, substrate 18 may be heated outside reactor vessel 4. For example, substrate 18 may be heated in a furnace outside reactor vessel 4 and placed in radially central core region 6 of reactor vessel 4. In other examples, substrate 18 may be heated by a heater in reactor vessel 4 before or during CVI/CVD to create a thermal gradient across substrate 18. For example, for non-isothermal CVI, substrate 18 may be heated at least one surface by a heater, such as a heater within or adjacent to substrate stand 14. In some examples, substrate stand 14 may rotate substrate 18 during heating to more evenly heat substrate 18. In some examples, rather than separately heating substrate 18, substrate 18 may be heated as part of heating reactor vessel 4 (20), described below.

The technique of FIG. 2 includes heating, using heat source 8, reactor vessel 4 to a reactor vessel temperature (20). Heat source 8 may heat reactor vessel 4 to create selected temperature conditions, temperature gradients, and the like, for CVI/CVD of substrate 18 in radially central core region 6 of reactor vessel 4. In some examples, heat source 8 may be a heater thermally coupled to reactor vessel 4 and controller 16 may control heat source 8 to heat reactor vessel 4 to the reactor vessel temperature. In some examples, such as techniques for isothermal CVI, heat source 8 heats reactor vessel 4 to a reactor vessel temperature that is substantially the same as a substrate temperature of substrate 18. In some examples, such as techniques for thermal gradient CVI, heat source 8 heats reactor vessel 4 to a reactor vessel temperature that is below a substrate temperature of substrate 18.

The technique of FIG. 2 also includes introducing, using at least one of reactor inlet(s) 10, a precursor gas to reactor vessel 4 (22). For example, controller 16 may control at least one of reactor inlet(s) 10 and, optionally, a precursor gas source, a control valve, jet ejector, pump, or the like to introduce the precursor gas to the internal volume of reactor vessel 4 (22). Reactor inlet(s) 10 may introduce the precursor gas and produce swirling flow of the precursor gas around radially central core region 6. In some examples, controller 16 may control at least one reactor inlet(s) 10 to create swirling flow in reactor vessel 4 by introducing precursor gas at a selected velocity, direction, flow rate, or the like. In some examples, respective ones of reactor inlet(s) 10 are operated at the same velocity, direction, and flow rate, while in other examples, respective ones of reactor inlet(s) 10 are operated at different velocities, directions, and flow rates. For example, reactor inlet(s) 10 positioned at different circumferential or axial locations on reactor vessel 4 may be operated at different velocities to maintain a substantially constant bulk flow rate of precursor gas through reactor vessel 4.

In some examples, reactor inlet(s) 10 may be configured to introduce the precursor gas at an angle relative to the outer wall of reactor vessel 4 to produce a particular swirling flow profile. The angle may be between 0 degrees and 90 degrees from a surface that is tangential to the outer wall of reactor vessel 4 at the location of the reactor inlet 10. For example, the angle of reactor inlet(s) 10 may be closer to 0 degrees for more laminar or higher residence flow and closer to 90 degrees for more turbulent flow. In some examples, in addition to being angled relative to the outer wall to produce swirling flow, reactor inlet(s) 10 may be oriented at an axial angle from a normal surface of the outer wall to produce an axial flow component to the swirled flow. For example, reactor inlet(s) may be configured to introduce the precursor gas into reactor vessel 4 at an axial angle between 0 and 10 degrees from a normal surface of the outer wall.

In some examples, reactor inlet(s) 10 may be configured to introduce the precursor gas at particular swirling flow conditions to increase the residence time of precursor gas in reactor vessel 4. For example, reactor inlet(s) 10 may introduce precursor gas at a particular velocity and a particular angle to create bulk swirled flow through reactor vessel 4. A particular volume of precursor gas that travels circumferentially around reactor vessel 4 may travel a greater total distance for a particular axial distance through reactor vessel 4 than a volume of precursor gas that travels axially does not travel circumferentially through reactor vessel 4. This longer distance and/or time may give the volume of precursor gas a greater opportunity to equilibrate the temperature of an outer wall of reactor vessel 4 with the swirled precursor gas flow. For example, reactor inlet(s) 10 may introduce precursor gas at an angle near tangent to the surface of the outer wall of reactor vessel 4 to produce swirled flow with a higher residence time than precursor gas introduced at an angle less tangent to the surface of the outer wall for a given flow rate. The precursor gas introduced at an angle near tangent may travel circumferentially around the reactor vessel for a greater total distance of travel per axial unit than precursor gas introduced at an angle further from the outer wall and at a smaller circumference of travel. This greater total distance of travel may increase the residence time of the precursor gas in reactor vessel 4.

In some examples, reactor inlet(s) 10 may be configured to introduce the precursor gas at particular swirling flow conditions to increase precursor transport at radially central core region 6. For example, reactor inlet(s) 10 may introduce precursor gas at a particular velocity to induce a centrifugal force on lower temperature fluid at radially central core region 6. This centrifugal force may enhance transport of higher temperature precursor gas to radially central core region 6 and substrate 18. For example, reactor inlet(s) 10 may introduce precursor gas at a higher velocity to create a greater centripetal force in radially central core region 6. As the swirling velocity increases, the centripetal force induced may increase, which may increase the displacement of cooler core precursor gas at substrate 18 with hotter precursor gas from the bulk fluid.

In some examples, reactor inlet(s) 10 may be configured to introduce the precursor gas at particular swirling flow conditions to increase mixing of bulk precursor gas in reactor vessel 4. For example, reactor inlet(s) 10 may introduce precursor gas at a particular velocity and a particular angle to create turbulence or convection conditions in reactor vessel 4. The turbulence or convection conditions may increase mixing of precursor gas to create more uniform temperature and precursor gas concentration through at least an axial segment (i.e. a cross-sectional segment of reactor vessel 4) of reactor vessel 4. For example, reactor inlet(s) 10 may introduce precursor gas at a higher velocity or at an angle that is less tangential from the outer wall of reactor vessel 4 to create more turbulent precursor flow to increase mixing of precursor gas. Turbulent flow in reactor vessel 4 may be related to the Reynolds number of the precursor flow in reactor vessel 4. The Reynolds number of precursor flow may be proportional to velocity, which may increase with higher precursor gas flow rates or velocities. In other examples, an angle that is less tangential to the surface of the outer wall of reactor vessel 4 may create irregular precursor gas flow, such as by intersecting opposite face of the outer wall or through shear force with gas moving in other directions, which may increase turbulence. Increased precursor gas turbulence may increase convective instability and aid in mixing of precursor gas through reactor vessel 4 and at substrate 18.

In some example, introducing the precursor gas to an interior of reactor vessel 4 may include heating the precursor gas to the precursor temperature. In some examples, the precursor temperature may be substantially the same as the reactor vessel temperature. For example, for isothermal CVI reactor operation, the precursor temperature may be substantially similar to the reactor vessel temperature and the substrate temperature to achieve a more uniform temperature distribution at substrate 18. In other examples, the precursor temperature may be substantially different than the reactor vessel temperature. For example, for reactor operation with a high residence time of the precursor gas, the precursor temperature may be lower than the reactor vessel temperature, as reactor vessel 4 may have a greater amount of time to heat the precursor gas to the reactor vessel temperature.

The technique of FIG. 2 includes removing, using at least one of reactor outlet(s) 12, exhaust gas from reactor vessel 4 (24). In some examples, reactor outlet(s) 12 may assist in creating swirling flow, controlling pressure, or controlling residence time in reactor vessel 4 by removing exhaust gas at a particular velocity, angle, flow rate, or the like. In some examples, reactor inlet(s) 10 and reactor outlet(s) 12 may control the bulk flow of precursor gas to create selected flow rates, pressures, residence times, temperatures, and the like, in reactor vessel 4. For example, one or more of reactor outlet(s) 12 may be positioned at an angle near tangent to the outer wall of reactor vessel 4 to direct flow circumferentially around reactor vessel 4. In other examples, reactor outlet(s) 12 may be positioned at an angle less tangent to the outer wall of reactor vessel 4 to direct flow less circumferentially around reactor vessel 4 and more radially from reactor vessel 4. In some examples, reactor outlet(s) 12 may remove exhaust gas at higher flow rates or velocities to reduce a pressure or residence time in reactor vessel 4.

In some examples, although not shown in FIG. 2, the technique may optionally include rotating, using substrate stand 14, substrate 18, such as about an axis extending substantially parallel to the axial direction of reactor vessel 4. In some examples, substrate stand 14 may selectively rotate substrate 18 in opposite rotational directions. For example, substrate stand 14 may rotate at a rate and direction that reduces the relative motion between substrate 18 and swirling precursor gas to assist in diffusion of precursor gas in substrate 18. In other examples, substrate stand 14 may rotate more quickly/slowly, may not rotate, or may rotate in the opposite direction of swirling precursor gas flow. For example, substrate stand 14 may counter-rotate during heating or cooling substrate 18 to reduce the amount of time to heat/cool substrate 18 or to more evenly heat/cool substrate 18. In some examples involving diffusive CVI or low pressure CVD, substrate stand 14 may rotate substrate 18 in the same direction as the swirling precursor gas flow (i.e. co-rotate) to reduce the relative velocity between the bulk precursor gas and substrate 18 and increase the diffusion of precursor gas into substrate 18 relative to convection of precursor gas into substrate 18. In some examples involving forced flow CVI or atmospheric CVD, substrate stand 14 may not rotate substrate 18 or may rotate substrate 18 in the opposite direction as the swirling precursor gas flow (i.e., counter-rotate) to increase the relative velocity between the bulk precursor gas and substrate 18 and increase the mixing at a surface of substrate 18.

The technique of FIG. 2 may include cooling reactor vessel 4, for example, to solidify deposited precursor into a ceramic matrix (26). In some examples, controller 16 may control reactor inlet(s) 10 to introduce relatively cooler inert gas into reactor vessel 4 to cool substrate 18. In other examples, such as examples using a heater, controller 16 may turn off or modulate the heater to cool down reactor vessel 4. In some examples, controller 16 may control substrate stand 14 to counter-rotate substrate 18 to increase a cooling rate of substrate 18.

In some examples, the technique of FIG. 2 may be used for isothermal CVI. For example, controller 16 may control heat source 8 to heat reactor vessel 4 to a temperature substantially the same as a temperature of substrate 18 (20).

Controller 16 may control at least one of reactor inlet(s) 10 to introduce a precursor gas at a temperature substantially the same as the temperature of substrate 18 (22).

In some examples, the technique of FIG. 2 may be used for thermal gradient CVI. For example, controller 16 may control heat source 8 to heat reactor vessel 4 to a temperature less than a temperature of substrate 18 (20). Controller 16 may control at least one of reactor inlet(s) 10 to introduce a precursor gas at a temperature less than the temperature of substrate 18 (22).

In some examples, the technique of FIG. 2 may be used for diffusive CVI. For example, controller 16 may control at least one of reactor inlet(s) 10 to introduce precursor gas at a velocity, flow rate, and/or angle (22), and control at least one of reactor outlet(s) 12 to remove exhaust gas at a velocity, flow rate, and/or angle (24), so that a pressure of reactor vessel 4 is substantially the same as a pressure in substrate 18.

In some examples, the technique of FIG. 2 may be used for forced flow CVI. For example, controller 16 may control at least one of reactor inlet(s) 10 to introduce precursor gas at a velocity, flow rate, and/or angle (22), and control at least one of reactor outlet(s) 12 to remove exhaust gas at a velocity, flow rate, and/or angle (24), so that a dynamic pressure of reactor vessel 4 is greater than a pressure in substrate 18.

In some examples, the technique of FIG. 2 may be used for low pressure CVD. For example, controller 16 may control at least one of reactor inlet(s) 10 to introduce precursor gas at a velocity, flow rate, and/or angle (22), and control at least one of reactor outlet(s) 12 to remove exhaust gas at a velocity, flow rate, and/or angle (24), so that a pressure in reactor vessel 4 is less than atmospheric pressure.

Further, isothermal CVI or thermal gradient CVI may be combined with diffusive CVI or forced flow CVI to achieve diffusive, isothermal CVI; diffusive, thermal gradient CVI; forced flow isothermal CVI, or forced flow, thermal gradient CVI by combining the various forms of parameter control described above.

Figure 3:
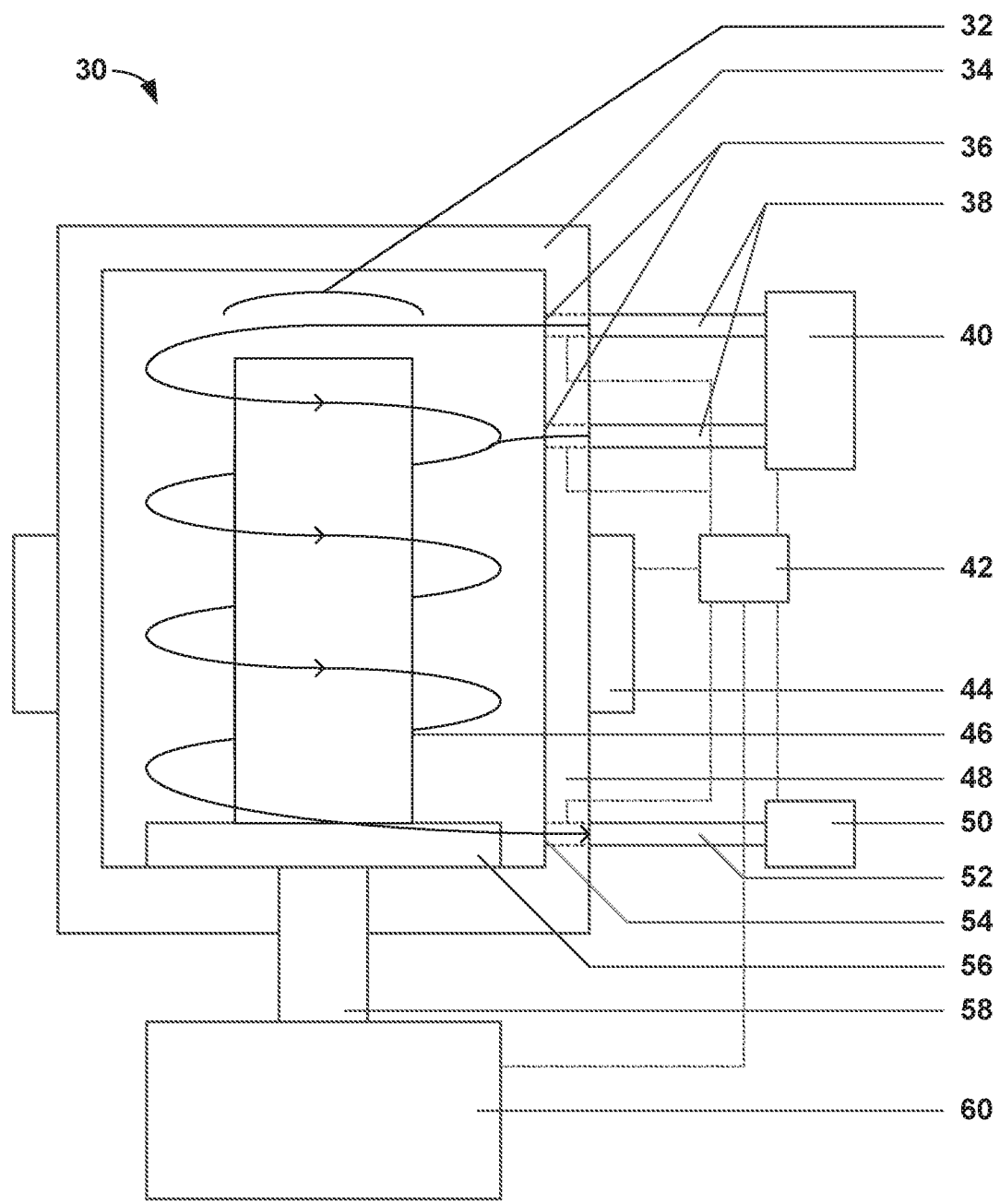
FIG. 3 is a conceptual cross-sectional diagram illustrating an example system for manufacturing a composite using chemical vapor infiltration or deposition.

FIG. 3 is a conceptual cross-sectional diagram illustrating an example system 30 for manufacturing composites using chemical vapor infiltration or deposition. The system 30 of FIG. 3 will be described with concurrent reference to system 2 of FIG. 1, although one of ordinary skill will understand that the system 30 of FIG. 3 may include more or fewer components.

System 30 includes reactor vessel 34. Reactor vessel 34 may be configured and operable similar to reactor vessel 4 as described in FIG. 1. Reactor vessel 34 may be configured to house substrate 46 in radially central core region 32. Substrate 46 and radially central core region 32 may be configured and operable similar to substrate 18 and radially central core region 6 as described in FIG. 1, respectively. Reactor vessel 34 may include outer wall 48. Outer wall 48 extends axially on the sides of reactor vessel 34 and circumferentially bounds an enclosed volume in which a CVI/CVD technique occurs.

System 30 may also include substrate stand 56. Substrate stand 56 may be configured and operable similar to substrate stand 14 as described in FIG. 1. In some examples, substrate stand 56 may be mechanically coupled to shaft 58 and motor 60. Motor 60 may be configured to selectively or controllably rotate shaft 58 and, correspondingly, rotate substrate stand 56. In some examples, substrate stand 56 may optionally include other components, such as a heater to heat substrate 46 for preheating or thermal gradient CVI.

System 30 also includes heat source 44 thermally coupled to reactor vessel 34. Heat source 44 may be configured and operable similar to heat source 4 described in FIG. 1. In this example, heat source 44 may directly heat outer wall 48 of reactor vessel 34 through conduction. Heat source 44 may be structurally joined with outer wall 48. For example, heat source 44 may be a fluid heater and cooler configured to heat reactor vessel 34 with a hot fluid and cool reactor vessel 34 with a cooler fluid. In some embodiments, heat source 44 may be configured to operate at different temperatures for different axial positions on reactor vessel 34.

In the example of FIG. 3, system 30 further includes two reactor inlets 36 in outer wall 48. Reactor inlets 36 may be configured and operable similar to reactor inlet(s) 10 as described in FIG. 1. In this example, two reactor inlets are shown extending through outer wall 48; however, in other example, greater or fewer reactor inlets 36 may be used. For example, reactor inlets 36 may be distributed around the circumference of reactor vessel 34, axially down the side of outer wall 48, or both. In this example, one of reactor inlets 36 is positioned near the top of reactor vessel 34 to create a first swirling flow, while the other of reactor inlets 36 is positioned axially below the top of reactor vessel 34 to create a second swirling flow that may boost or reinforce the first swirling flow. Each of reactor inlets 36 is coupled to an inlet feed 38. Each of inlet feeds 38 is configured to transport precursor gas to reactor vessel 34 through one of reactor inlets 36. In other examples, inlet feeds 38 may transport inert gas to reactor vessel 34. Inlet feeds 38 may be coupled to preheater 40. Preheater 40 may be configured to heat precursor gas to a selected temperature for CVI/CVD. In other examples, preheater 40 may be configured to heat other gases, such as inert gases, carrier gases, or post-processing gases, to a selected temperature.

System 30 also includes a reactor outlet 54 in outer wall 48. Reactor outlet 54 may be configured and operable similar to reactor outlet(s) 12 as described in FIG. 1. In this example, one reactor outlet 54 is shown extending through outer wall 48; however, in other examples, more than one reactor outlet 54 may be used. For example, reactor outlets 54 may be distributed around the circumference of outer wall 48 or axially down the side of outer wall 48. Reactor outlet 54 is coupled to an outlet drain 52. Outlet drain 52 is configured to transport exhaust gas from reactor vessel 34 through reactor outlet 48. Outlet drain 52 may be coupled to a vacuum pump 50 or other post-processing equipment, such as a scrubber. Vacuum pump 50 may be configured to create suction pressure for reactor vessel 34.

System 30 may also include controller 42. Controller 42 may be configured and operable similar to controller 16 as described in FIG. 1. Controller 42 may be communicatively coupled to heat source 44, preheater 40, reactor inlets 36, reactor outlet 54, vacuum pump 50, and motor 60. Controller 42 may be configured to control: heat source 44 at selected reactor vessel temperatures, temperature gradients, and the like; preheater 40 at selected precursor gas temperatures, inert gas temperatures, and the like; reactor inlets 36 for selected velocities, flow rates, and directions; reactor outlet 54 for selected velocities, flow rates, directions, and the like; vacuum pump 50 for selected pressures, flow rates, and the like; and motor 60 for selected rotational frequency, substrate velocity, and the like.

Figure 4:
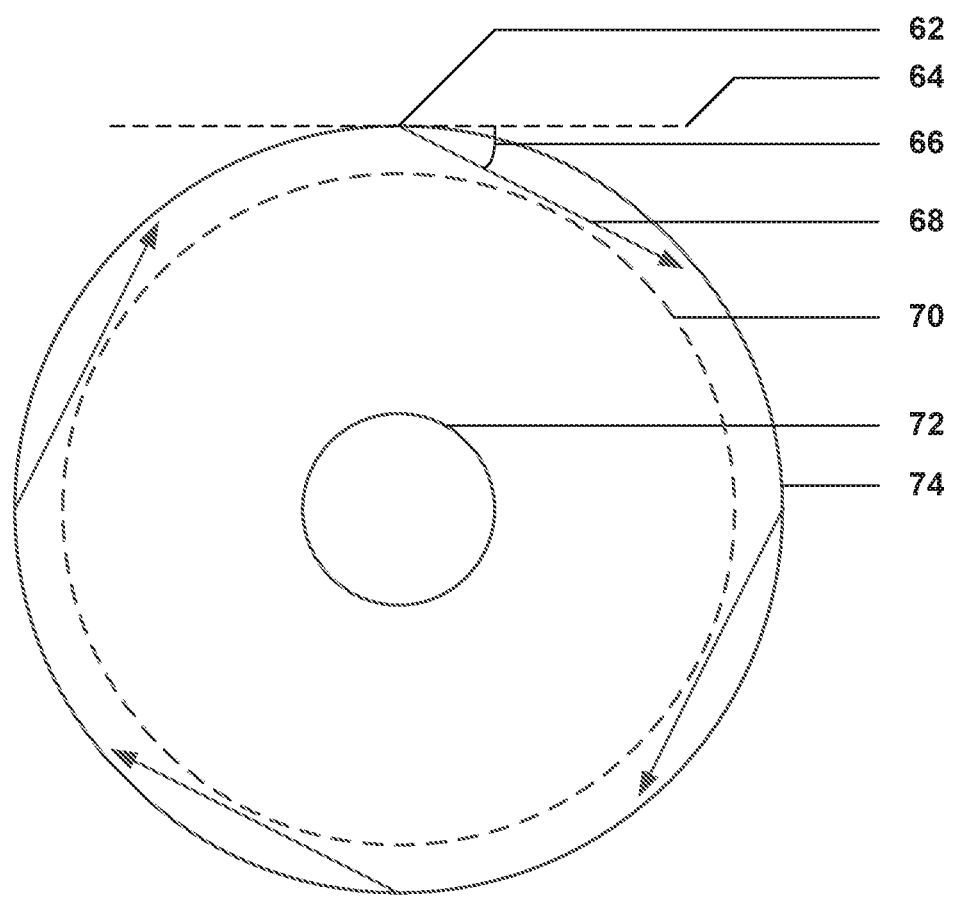
FIG. 4 is a conceptual cross-sectional diagram illustrating example circumferential positions for reactor inlets in a chemical vapor infiltration or deposition apparatus.

FIG. 4 is a conceptual cross-sectional diagram illustrating example circumferential positions for reactor inlets for FIG. 1. A reactor vessel 74 may have a radially central core region 72 and four inlets 62 positioned circumferentially around reactor vessel 74. Reactor vessel 74, radially central core region 72, and reactor inlet(s) 62 may be configured and operable similar to reactor vessel 4, radially central core region 6, and reactor inlet(s) 10 as described in FIG. 1, respectively. In other examples, greater or fewer than four reactor inlets 62 may be used, while in other examples, reactor inlets 62 may be positioned at different circumferential positions around reactor vessel 62, such as symmetrical or unsymmetrical positions. Flow direction 68 represents the direction of, for example, precursor gas flow from reactor inlet 62. Reactor inlet 62 is positioned so that flow direction 68 is at radial angle 66 from tangential surface 64 of the outer wall of reactor vessel 74. Reactor inlet 62 may be positioned so that flow from reactor inlet 62 at flow direction 68 produces swirled flow 70 through reactor vessel 74 and around radially central core region 72. In some examples, reactor inlet 62 may be positioned at a radial angle 66 from tangential surface 64 to produce swirled flow 70 at a generally greater circumference than a greater radial angle 66 from tangential surface 64. In some examples, reactor inlet 62 may be positioned at a radial angle 66 from tangential surface 64 to produce swirled flow 70 having a greater velocity at a greater circumference and a slower velocity at a smaller circumference than a greater radial angle 66 from tangential surface 64.

EXAMPLES

Pre-heating step. A porous preform may be constructed by weaving SiC fibers into a porous preform. The SiC fiber porous preform may be placed into a reactor vessel that includes reactor inlets in the reactor vessel. A reactor vessel heater temperature ($T_f$) may be set to $T_{rv}$=1000° C. to heat the internal volume of the reactor vessel to a reactor vessel temperature. Additionally, nitrogen gas may be heated to a furnace gas temperature ($T_g$) of $T_g$=1000° C. and injected at a high flow rate through the reactor inlets to produce a swirled flow in the reactor vessel and help heat the internal volume of the reactor vessel to a reactor vessel temperature. A substrate stand may be rotated counter to the direction of swirled flow to further reduce preheat time for the reactor vessel and porous preform.

Infiltration step—isothermal, diffusive transport. With the reactor vessel heater remaining at $T_{rv}$=1000° C., a mixture of methyltrichlorosilane and hydrogen gas may be pre-heated to $T_{rv}$=1000° C. and injected through reactor inlets nearly tangentially to the walls of the reactor vessel to create a swirled flow in the reactor vessel. There is an extended time for gas decomposition due to the swirled flow. The flow rate may be set so that bulk swirl velocities away from the walls of the furnace are comparable to the diffusive velocity of the mixture. The substrate stand may be co-rotated with the bulk swirled flow to promote diffusive transport through the porous preform to occur primarily in the radial direction. The diffusive velocity may be increased due to an increase in the concentration differences within and outside the porous preform, while the diffusive velocity length scale in the swirled flow furnace may be approximately half of the diffusive velocity length scale in an axially-flowed furnace. The system may be held at $T_{rv}$=1000° C. until the desired densification is achieved in the porous preform.

Infiltration step—isothermal, forced flow. With the reactor vessel heater remaining at $T_{rv}$=1000° C., a mixture of methyltrichlorosilane and hydrogen gas may be pre-heated to $T_g$=1000° C. and injected through reactor inlets nearly tangentially to the walls of the reactor vessel to create a swirled flow. The flow rate and angle may be set to produce convection velocities of the gases. Uniform bulk velocity zones may be created to match porous preform permeability and/or a multiple porous preform loading configuration.

Infiltration step—thermal gradient, diffusive transport. With the reactor vessel heater reduced to $T_{rv}$=900° C. after pre-heating is complete, a mixture of methyltrichlorosilane and hydrogen gas may be pre-heated to $T_g$=900° C. and injected through reactor inlets nearly tangentially to the walls of the reactor vessel to create a swirled flow. The difference in porous preform temperature and gas/reactor vessel temperature may create a thermal gradient in the porous preform which yields a hotter porous preform interior temperature due to direct contact of only the porous preform outer surface to the lower temperature furnace gases. The time for which a thermal gradient may be created may be reduced with greater flow from the reactor inlets. The flow rate may be set so that bulk swirl velocities away from the walls of the reactor vessel are comparable to the diffusive velocity of the mixture. The substrate stand may be co-rotated with the bulk swirled flow to promote diffusive transport through the porous preform to occur primarily in the radial direction.

Infiltration step—thermal gradient, forced flow. With the reactor vessel heater reduced to $T_{rv}$=900° C., a mixture of methyltrichlorosilane and hydrogen gas may be pre-heated to $T_g$=900° C. and injected through reactor inlets nearly tangentially to the walls of the reactor vessel to create a swirled flow. The flow rate and angle may be set to produce convection velocities of the gases. Uniform bulk velocity zones may be created to match porous preform permeability and/or a multiple porous preform loading configuration.

Cool down step. The reactor vessel heater may be turned off and reactor vessel walls cooled. The reactor vessel may be flushed with nitrogen gas at $T_g$=300 injected through reactors inlets at high flow while counter-rotating the substrate stand.

Various examples have been described. These and other examples are within the scope of the following claims.

What is claimed is:
1. A system comprising:
a cylindrical reactor vessel comprising an outer wall and defining an axis, wherein the reactor vessel is configured to house a porous preform in a radially central core region;
a rotating substrate stand configured to rotate the porous preform;
a heat source thermally coupled to the reactor vessel;
at least one reactor inlet in the outer wall configured to introduce a precursor gas to the reactor vessel to produce circumferentially swirling flow of the precursor gas around the radially central core region of the reactor vessel, wherein the at least one reactor inlet is positioned horizontally at a top of the reactor vessel; and
at least one reactor outlet configured to remove exhaust gas from the reactor vessel, wherein the at least one reactor outlet is positioned at a bottom of the reactor vessel.
2. The system of claim 1, wherein the at least one reactor inlet includes a first reactor inlet and a second reactor inlet, and wherein the first reactor inlet and the second reactor inlet are disposed at different axial locations of the outer wall.
3. The system of claim 1, wherein the at least one reactor inlet is configured to introduce the precursor gas at a radial angle between 0 and 90 degrees from a tangential surface of the outer wall.

4. The system of claim 1, wherein the at least one reactor inlet is configured to introduce the precursor gas at an axial angle between 0 and 10 degrees from a normal surface of the outer wall.

5. The system of claim 1, wherein the at least one reactor inlet is configured to introduce an inert gas to the reactor vessel.

6. The system of claim 1, wherein the heat source is configured to directly heat the outer wall through conduction.

7. The system of claim 1, wherein the heat source is structurally joined with the outer wall.

8. The system of claim 7, wherein the heat source comprises a fluid heater and cooler configured to heat the reactor vessel with a hot fluid and cool the reactor vessel with a cooler fluid.

9. The system of claim 1, wherein the heat source is configured to operate at different temperatures for different axial positions on the reactor vessel.

10. The system of claim 1, wherein the heat source further comprises a preheater configured to heat the precursor gas to a selected temperature.

11. The system of claim 1, wherein the at least one reactor outlet further comprises a plurality of reactor outlets distributed at least one of around the circumference of the outer wall or axially down the side of the outer wall.

12. The system of claim 1, wherein the at least one reactor outlet further comprises a control valve configured to maintain a particular pressure in the reactor vessel.

13. The system of claim 1, further comprising a vacuum pump coupled to the at least one reactor outlet and configured to create suction pressure for the reactor vessel.

14. The system of claim 1, wherein the at least one reactor inlet comprises a jet ejector.

* * * * *